(12) United States Patent
Yamashita et al.

(10) Patent No.: US 9,497,895 B2
(45) Date of Patent: Nov. 15, 2016

(54) LOWER RECEIVING PIN ARRANGEMENT METHOD AND LOWER RECEIVING PIN RETURN METHOD

(75) Inventors: Shirou Yamashita, Yamanashi (JP); Hironori Kitashima, Yamanashi (JP); Tadashi Endo, Yamanashi (JP); Hiroshi Matsumura, Yamanashi (JP); Mie Morishima, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 251 days.

(21) Appl. No.: 13/996,743

(22) PCT Filed: Sep. 11, 2012

(86) PCT No.: PCT/JP2012/005762
§ 371 (c)(1),
(2), (4) Date: Jun. 21, 2013

(87) PCT Pub. No.: WO2013/114478
PCT Pub. Date: Aug. 8, 2013

(65) Prior Publication Data
US 2014/0201998 A1    Jul. 24, 2014

(30) Foreign Application Priority Data
Feb. 2, 2012 (JP) ................. 2012-020567

(51) Int. Cl.
*H05K 13/04* (2006.01)
*H05K 13/00* (2006.01)

(52) U.S. Cl.
CPC ...... *H05K 13/0015* (2013.01); *H05K 13/0061* (2013.01); *Y10T 29/49169* (2015.01)

(58) Field of Classification Search
CPC ................. H05K 13/0069; Y10T 29/53265

USPC ............... 29/760, 701, 739, 740, 743, 744; 414/222.05
See application file for complete search history.

(56) References Cited

U.S. PATENT DOCUMENTS

| 4,951,383 A * | 8/1990 | Amao ............. H05K 13/021 29/721 |
| 5,218,753 A * | 6/1993 | Suzuki ........... H05K 13/0069 29/740 |

(Continued)

FOREIGN PATENT DOCUMENTS

| CN | 1922949 A | 2/2007 |
| CN | 101836524 A | 9/2010 |

(Continued)

OTHER PUBLICATIONS

International Search Report for PCT/JP2012/005762 dated Oct. 23, 2012.

(Continued)

*Primary Examiner* — Peter DungBa Vo
*Assistant Examiner* — Kaying Kue
(74) *Attorney, Agent, or Firm* — Pearne & Gordon LLP

(57) ABSTRACT

A pre-array temporary placement area A2 and a post-return temporary placement area A3 are set along with a lower receiving area A1. Temporary placement positions TP for lower receiving pins 22 in the pre-array temporary placement area A2 and the post-return temporary placement area A3 are previously assigned in consideration of requirements for preventing occurrence of interference between the lower receiving pins 22, which would otherwise occur during transfer of the lower receiving pins 22, and in accordance with array positions AP of the lower receiving pins 22 in the lower receiving area A1. Further, a transfer sequence is set in accordance with array positions AP.

3 Claims, 9 Drawing Sheets

(56) References Cited

U.S. PATENT DOCUMENTS

| | | | | |
|---|---|---|---|---|
| 5,794,329 | A * | 8/1998 | Rossmeisl | H05K 13/0069 29/703 |
| 5,932,065 | A * | 8/1999 | Mitchell | H05K 3/3415 156/382 |
| 6,212,751 | B1 * | 4/2001 | Hattori | G05B 19/402 29/407.04 |
| 6,352,073 | B1 * | 3/2002 | Kurosawa | B28D 5/0094 125/35 |
| 6,635,308 | B1 * | 10/2003 | Forrest | H05K 3/3415 101/129 |
| 6,651,316 | B2 * | 11/2003 | Isogai | H05K 13/0069 29/739 |
| 6,655,671 | B2 * | 12/2003 | Iwaki | H05K 13/0069 269/21 |
| 6,945,151 | B1 * | 9/2005 | Tripard | H01L 21/481 83/467.1 |
| 7,089,655 | B2 * | 8/2006 | Isogai | H05K 13/0069 29/739 |
| 7,447,045 | B2 * | 11/2008 | Ikeya | H05K 7/142 174/138 E |
| 2002/0021953 | A1 * | 2/2002 | Isogai | H05K 13/0069 414/222.05 |
| 2010/0262276 | A1 | 10/2010 | Sumi | |
| 2011/0268346 | A1 | 11/2011 | Ito et al. | |

FOREIGN PATENT DOCUMENTS

| | | |
|---|---|---|
| CN | 102238862 A | 11/2011 |
| JP | 2002-026597 A | 1/2002 |
| JP | 2002-57498 A | 2/2002 |
| JP | 2004-335973 A | 11/2004 |
| JP | 2009-032825 A | 2/2009 |
| JP | 2011-009470 A | 1/2011 |
| JP | 2011-014627 A | 1/2011 |

OTHER PUBLICATIONS

Office Action for Chinese Application No. 201280005487.1 dated Dec. 3, 2015.

* cited by examiner

FIG. 5
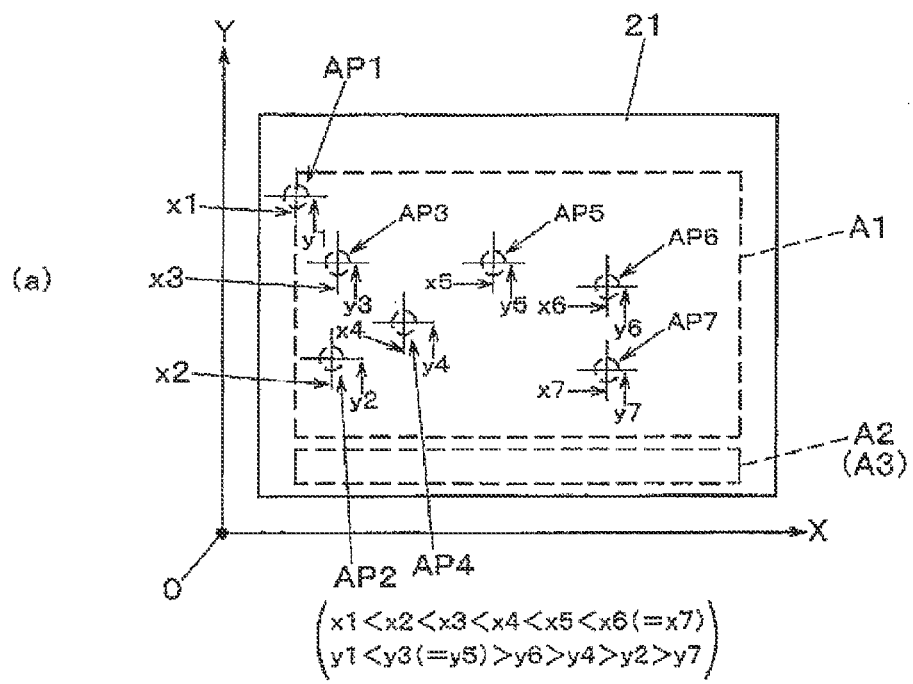
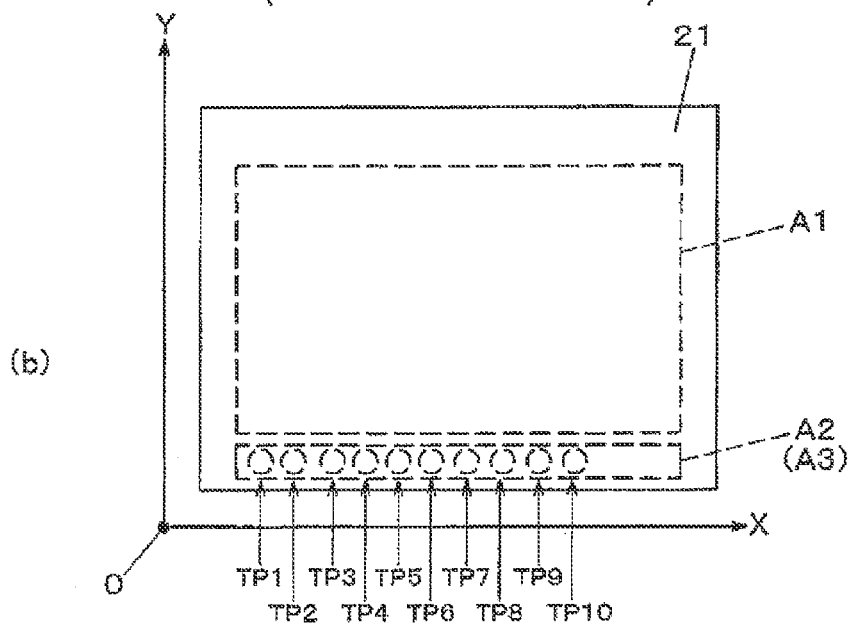

34 PRE-ARRAY TEMPORARY PLACEMENT POSITION ASSIGNMENT DATA

| ARRAY POSITION (34a) | AP1 | AP2 | AP3 | AP4 | AP5 | AP6 | AP7 | PIN-PASSING AREA (A4) | | |
|---|---|---|---|---|---|---|---|---|---|---|
| TEMPORARY PLACEMENT POSITION (34b) | TP10 | TP9 | TP8 | TP7 | TP6 | TP5 | TP4 | TP3 | TP2 | TP1 |
| TRANSFER PERFORMANCE SEQUENCE (34c) | (10) | (9) | (8) | (7) | (6) | (5) | (4) | (3) | (2) | (1) |

(b)

35 POST-RETURN TEMPORARY PLACEMENT POSITION ASSIGNMENT DATA

| ARRAY POSITION (35a) | AP1 | AP2 | AP3 | AP4 | AP5 | AP6 | AP7 | PIN-PASSING AREA (A4) | | |
|---|---|---|---|---|---|---|---|---|---|---|
| TEMPORARY PLACEMENT POSITION (35b) | TP10 | TP9 | TP8 | TP7 | TP6 | TP5 | TP4 | TP3 | TP2 | TP1 |
| TRANSFER PERFORMANCE SEQUENCE (35c) | (1) | (2) | (3) | (4) | (5) | (6) | (7) | (8) | (9) | (10) |

FIG. 9
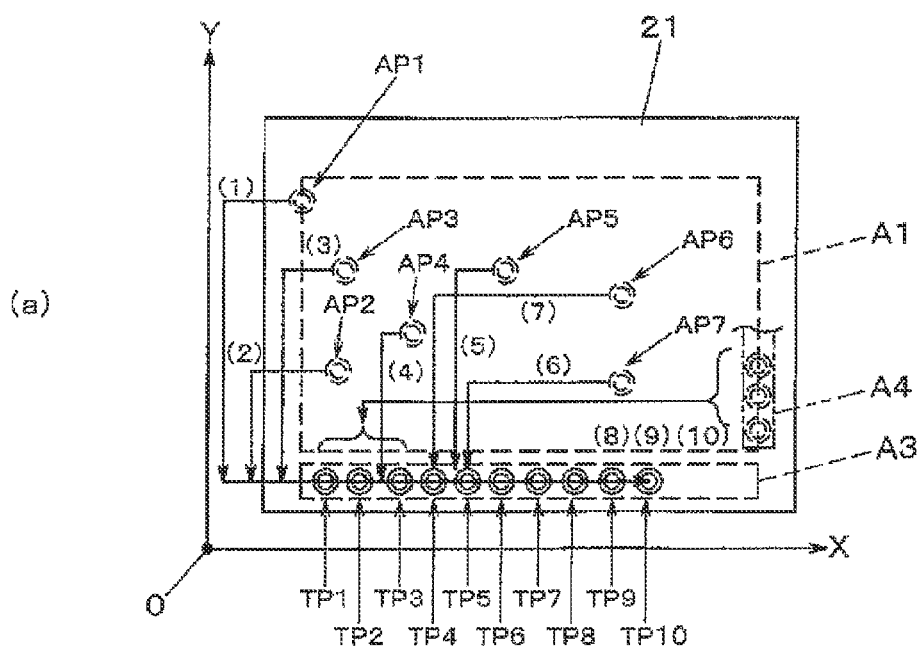
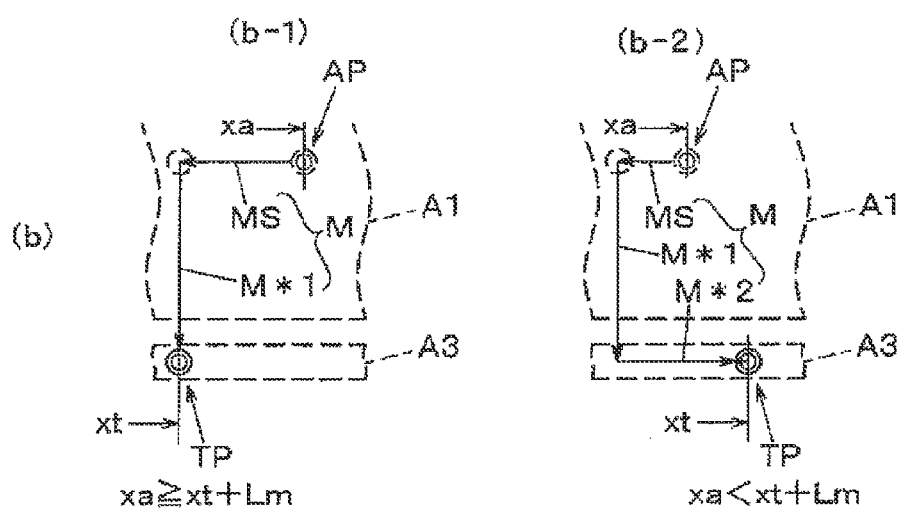

LOWER RECEIVING PIN ARRANGEMENT METHOD AND LOWER RECEIVING PIN RETURN METHOD

TECHNICAL FIELD

The present invention relates to a lower receiving pin arrangement method for arraying lower receiving pins in a lower receiving base in an electronic parts mounting apparatus and a lower receiving pin return method for returning the lower receiving pins, which have been arrayed and used, to predetermined locations.

BACKGROUND ART

In a parts mounting process of mounting electronic parts on a substrate, a substrate is positioned and retained while a downside of the substrate is supported by a lower receiving section. A lower receiving pin technique for bringing a plurality of lower receiving pins in contact with a downside of a substrate and supporting the substrate has widely been used as the technique for receiving a downside of a substrate. A method which has hitherto been known as a pin arrangement method for use with the lower receiving pin technique is to removably fit backup pins (lower receiving pins) upright into pin insert holes opened in a lattice pattern in a backup base (a lower receiving base) (see; for instance, Patent Documents 1 and 2). According to the related art technique described in connection with the examples of Patent Documents, an area in the backup base where the substrate is not placed is used as a stock area for housing backup pins that do not support a substrate. In Patent Document 1, a transfer sequence is set in consideration of a distance of a transfer location, where backup pins are transferred, from the stock area, thereby hindering the backup pins from interfering with each other during transfer operation.

RELATED ART DOCUMENT

Patent Document

Patent Document 1: JP-A-2011-9470
Patent Document 2: JP-A-2011-14627

SUMMARY OF THE INVENTION

Problem that the Invention is to Solve

By an increase in packaging density associated with a recent progress in miniaturization of electronic equipment, there exists a necessity for setting arrangement of lower receiving pins on a mount board in more detail. However, a lower receiving base in which pin attachment holes are arrayed in a lattice pattern has been employed in the existing techniques, including the related arts described in connection with the patent documents. Therefore, a restriction is imposed on spacing between the lower receiving pins arranged on the lower receiving base, which poses difficulty in high-precision arrangement of pins. In order to surmount the problem, a technique for placing lower receiving pins, which are capable of standing upright by themselves, at arbitrary locations on the lower receiving base by magnetic fixing has come into usage in place of the lower receiving base type in which the pin attachment holes are arrayed in a lattice pattern.

Incidentally, according to such a technique of arraying the lower receiving pins at arbitrary positions on the lower receiving base, the lower receiving pins are vulnerable to mutual interference during transfer work for arraying lower receiving pins or transfer work for returning the lower receiving pins from the lower receiving base in order to switch a model after usage. Specifically, in the related art technique primarily based on the lattice-like arrangement, assured spacing exists between the lower receiving pins, and hence prevention of interference is easy. However, under the technique of placing the lower receiving pins at arbitrary locations, pin arrangement is set with the minimum spacing between radial dimensions of the pins. Accordingly, if setting of sequence and a movement pathway of the lower receiving pins are inappropriate, the pins might interfere with each other during movement.

Interference of the pins can be prevented by setting an elevation stroke, which is employed during pin movement, to a pin height or greater. However, in this case, excessive setting of a transfer head stroke incurs an increase in equipment cost. Further, a delay in operation time due to arrangement and returning of pins which are required, every time a substrate type is switched, in conjunction with an increase in elevation stroke, results in occurrence of a tact loss. Thus, deterioration of efficiency and productivity is inevitable. As above, the electronic parts mounting apparatus that places the lower receiving pins at arbitrary locations on the lower receiving base encounters problems, such as difficulty in improving work for arraying and returning the lower receiving pins.

Accordingly, the present invention aims at providing a lower receiving pin arrangement method and a lower receiving pin return method that can make more efficient work for arraying and returning lower receiving pins in an electronic parts mounting apparatus.

Means for Solving the Problem

A lower receiving pin arrangement method of the present invention is a lower receiving pin arrangement method for an electronic parts mounting apparatus that mounts electronic parts on a substrate, wherein a plurality of lower receiving pins for receiving and supporting a downside of the substrate are arranged at arbitrary positions in a lower receiving area set in a lower receiving base, the method comprising an arrangement performance step of transferring the lower receiving pin from a temporary placement position set in a pre-array temporary placement area which is set in the lower receiving base along a first direction and where the plurality of lower receiving pins are temporarily placed before arranged and arranging the transferred lower receiving pin at an array position in the lower receiving area, wherein individual transfer operation to be performed, in the arrangement performance step, to transfer in turn the lower receiving pins at the array positions which are ordered in decreasing sequence of first-direction coordinate value includes a combination of at least two of a first positive transfer operation transferred in a positive direction along the first direction, a first negative transfer operation transferred in a negative direction along the first direction, a second positive transfer operation transferred in a positive direction along a second direction orthogonal to the first direction, and a second negative transfer operation transferred in a negative direction along the second direction; and a final transfer operation in which the lower receiving pins reach the array positions in each of the individual transfer operations is the first positive transfer operation.

A lower receiving pin return method of the present invention is a lower receiving pin return method for an electronic parts mounting apparatus that mounts electronic parts on a substrate, wherein a plurality of lower receiving pins, which are arranged at arbitrary positions in a lower receiving area set in a lower receiving base to thereby receive and support a downside of the substrate, are picked up from the lower receiving area and returned, the method comprising a return performance step of transferring the plurality of lower receiving pins arranged at array positions in the lower receiving area, in turn, to temporary placement positions set in a post-return temporary placement area which is set in the lower receiving base along its edge in a first direction and where the plurality of returned lower receiving pins are temporarily placed, wherein individual transfer operation to be performed, in the return performance step, to transfer in turn the lower receiving pins at the array positions which are ordered in increasing sequence of first-direction coordinate value includes a combination of at least two of a first positive transfer operation transferred in a positive direction along the first direction, a first negative transfer operation transferred in a negative direction along the first direction, a second positive transfer operation transferred in a positive direction along a second direction orthogonal to the first direction, and a second negative transfer operation transferred in a negative direction along the second direction; and transfer initiation operation in which the lower receiving pin goes off from the array position in each of the individual transfer operations is the first negative transfer operation.

Advantage of the Invention

According to the present invention, the final transfer operation in which the lower receiving pin reaches the array position by the individual transfer operation intended for transferring in turn the lower receiving pins at the array positions ordered in decreasing sequence of first-direction coordinate value is taken, as the first positive transfer operation in which transfer is effected in a positive direction along the first direction, in the arrangement performance step of transferring the lower receiving pin from the pre-array temporary placement area which is set in the lower receiving base along the first direction and where the plurality of lower receiving pins are temporarily placed before arranged, to thereby arrange the thus-transferred lower receiving pin at the array position in the lower receiving area. Further, the transfer initiation operation for transferring the lower receiving pin from the array position by the individual transfer operation intended for transferring in turn the lower receiving pins at the array positions ordered in decreasing sequence of first-direction coordinate value is taken, as the first negative transfer operation transferred in a negative direction along the first direction, in the return performance step of transferring in turn the plurality of lower receiving pins arranged at the array positions in the lower receiving area to the post-return temporary placement area. Thereby, there can be effectively prevented interference of lower receiving pins during transfer, which would otherwise occur in the arrangement performance step of arranging the lower receiving pin to the lower receiving area and the return performance step of returning the lower receiving pin from the lower receiving area. Work for arranging and returning the lower receiving pins can be made efficient.

BRIEF DESCRIPTION OF THE DRAWINGS

FIG. 5 is view in which (a) and (b) are explanatory views of pin arrangement data and temporary placement position data pertaining to lower receiving pins in the lower receiving base of the electronic parts mounting apparatus of the embodiment of the present invention.

FIG. 7 is view in which (a) and (b) are explanatory views of data pertaining to assignment of temporary placement positions o the lower receiving pins in the lower receiving base of the electronic parts mounting apparatus of the embodiment of the present invention.

FIG. 9 is view in which (a) and (b) are explanatory views of operation pertinent to a lower receiving pin return method in the electronic parts mounting apparatus of the embodiment of the present invention.

EMBODIMENT FOR IMPLEMENTING THE PRESENT INVENTION

Figure 1:
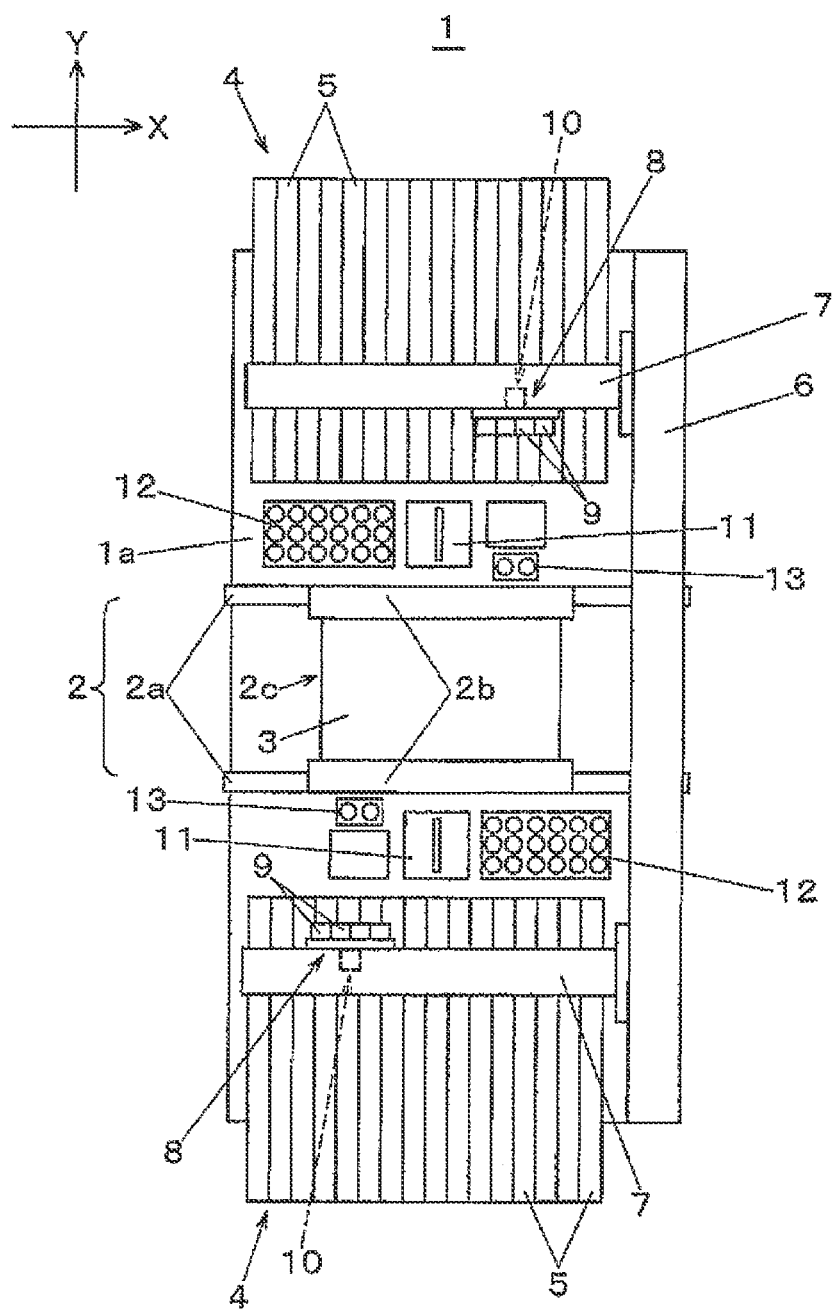
FIG. 1 is a plan view showing a configuration of an electronic parts mounting apparatus of an embodiment of the present invention.

An embodiment of the present invention is now described by reference to the drawings. First, by reference to FIG. 1 and (a) and (b) in FIG. 2, an entire configuration of an electronic parts mounting apparatus 1 is described. The electronic parts mounting apparatus 1 has a function of retaining an electronic part with a pickup nozzle attached to a mount head and mounting the electronic part on a substrate. In FIG. 1, a substrate conveyance mechanism 2 is disposed in a center of a bench 1a in an X direction (a conveying direction of a substrate). The substrate conveyance mechanism 2 has a function of conveying a substrate 3 conveyed into the electronic parts mounting apparatus from an upstream side and positioning the substrate 3 at a mounting work position for a parts mounting mechanism to be described below, and includes two conveyance rails 2a laid in parallel with each other. Disposed at a center of the substrate conveyance mechanism 2 are a substrate lower receiving mechanism 2c for receiving a downside of the carried-in substrate 3 and press members 2b for pressing and clamping from above mutually-opposed two lateral ends of the substrate 3 raised by the substrate lower receiving mechanism 2c.

A parts feed section 4 for feeding electronic parts that are targets of mounting is disposed on either side of the substrate conveyance mechanism 2. A plurality of tape feeders 5 are placed side by side in the individual parts feed section 4. The individual tape feeder 5 has a function of pitch-feeding a part held on a carrier tape to an eject position by a parts mounting mechanism to be described hereinbelow. A Y-axis movable table 6 is placed at an elevated position on one end of a top surface of the bench 1a in the X direction, and two X-axis movable tables 7 are joined to the Y-axis movable table 6 so as to be slidable in a Y direction. A mount head 8 is attached to each of the X-axis movable tables 7 so as to be slidable in the X direction.

The mount head 8 is a multiple head made up of a plurality of unit retaining heads 9. A pickup nozzle 14A for picking up parts by suction (see (a) in FIG. 3), which is attached to a nozzle holder 9a provided at a lower end of the individual unit retaining head 9, retains by vacuum suction an electronic part P which is a target of mounting and which is fed from the tape feeder 5. The Y-axis movable table 6 and the X-axis movable tables 7 make up a head moving mechanism for moving the mount heads 8. By actuating the head moving mechanism, the individual mount head 8 moves between the parts feed section 4 and the substrate 3 positioned by the substrate conveyance mechanism 2. The individual mount head 8 moves up and down with respect to the substrate 3, thereby mounting the retained electronic part P (see (a) in FIG. 3) to the substrate 3. The mount head 8 and the head moving mechanism for moving the mount head 8 make up a parts mounting mechanism that picks up a part from the corresponding parts feed section 4 and mounts the part on the substrate 3.

A substrate recognition camera 10 that moves integrally along with the mount head 8 is attached to an downside of the individual X-axis movable table 7. The substrate recognition camera 10 is moved to an elevated location above the substrate 3 retained by the substrate conveyance mechanism 2 by actuation of the head moving mechanism, whereby the substrate recognition camera 10 captures an image of a recognition mark made on the substrate 3. A parts recognition camera 11, a first nozzle housing 12, and a second nozzle housing 13 are disposed along a movement pathway of the mount head 8 between the parts feed section 4 and the substrate conveyance mechanism 2. The mount head 8 that has picked up a part from the parts feed section 4 performs scanning operation by which the mount head passes through an elevated position above the parts recognition camera 11 in a predetermined direction, whereby the parts recognition camera 11 captures an image of a part retained by the corresponding mount head 8.

The pickup nozzle 14A attached to the nozzle holder 9a of the unit retaining head 9 is housed and held in numbers, in correspondence with a parts type, within the first nozzle housing 12. Pickup nozzles 14B each of which retains a lower receiving pin 22 attached to the nozzle holder 9a of the unit retaining head 9 are housed and retained in the second nozzle housing 13. The individual mount head 8 accesses the first nozzle housing 12 and the second nozzle housing 13, to thus perform nozzle replacement operation, whereby the pickup nozzles to be attached to the respective unit retaining heads 9 can be replaced in accordance with an objective and a type of target part.

Figure 2:
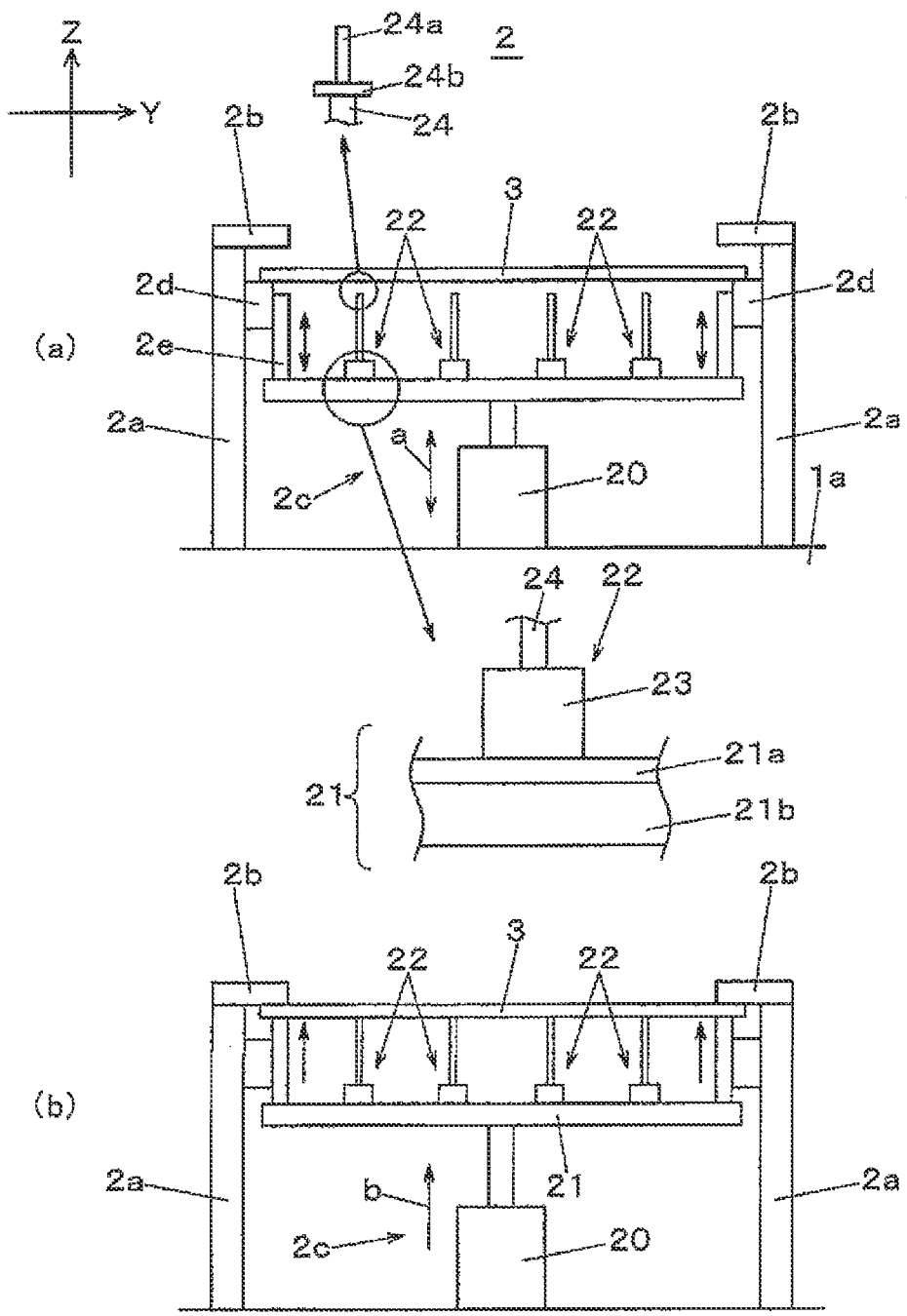
FIG. 2 is drawing in which (a) and (b) explain a configuration of a substrate conveyance mechanism and a substrate lower receiving mechanism in the electronic parts mounting apparatus of the embodiment of the present invention.

By reference to (a) and (b) in FIG. 2, a configuration and a function of the substrate conveyance mechanism 2 are described. As shown in (a) and (b) in FIG. 2, the substrate conveyance mechanism 2 is made up of the two conveyance rails 2a laid in parallel with each other. Conveyance mechanisms 2d are placed inside the conveyance rails 2a along a conveying direction. The conveyance mechanisms 2d are actuated while both lateral ends of the substrate 3 remain in contact with top surfaces of the respective conveyance mechanisms 2d, whereby the substrate 3 is conveyed in the conveying direction of a substrate. A substrate lower receiving mechanism 2c is placed in a center of the substrate conveyance mechanism 2 in correspondence with a work position for the parts mounting mechanism.

The substrate lower receiving mechanism 2c is configured so as to lift up and lower (along arrow "a") a horizontal plate-like lower receiving base 21 by an elevation mechanism 20. The lower receiving pins 22 for supporting the substrate 3 from its downside are provided upright on a top surface of the lower receiving base 21. The individual lower receiving pin 22 is configured such that a rod-shaped portion 24 extends upward from a base 23 that comes into contact with the lower receiving base 21. A contact 24a which comes into contact with and supports the downside of the substrate 3 and a flange 24b that retains, by suction, the lower receiving pin 22 by the pickup nozzle 14B are placed on an upper end of the individual rod-shaped portion 24.

The lower receiving base 21 is configured by covering a top surface of a plate member 21b made of a non-magnetic substance, like aluminum, with a magnetic substance 21a, like a steel plate. The lower receiving pins 22 are placed at arbitrary positions on the magnetic substance 21a, in accordance with positions for receiving the downside of the substrate 3 whose downside is to be received by the lower receiving pins 22. In the arrangement for receiving a downside, by magnet members (omitted from the drawings) accommodated in respective bases 23, the lower receiving pins 22 are fixed to arbitrary positions of the lower receiving base 21 by dint of attracting magnetic force which acts between the lower receiving pins 22 and the magnetic substance 21a.

In this state, as shown in FIG. 2(b), the lower receiving base 21 is lifted (as designated by arrow "b") by actuation of the elevation mechanism 20. The contact 24a provided on the upper end of the individual rod-shaped portion 24 thereby comes into contact with the downside of the substrate 3, and the downside of the substrate 3 is received and retained by the plurality of lower receiving pins 22 of the substrate lower receiving mechanism 2c. Further, both ends of the substrate 3 are pressed against the downsides of the respective press members 2b, to thus be fixedly positioned.

Figure 3:
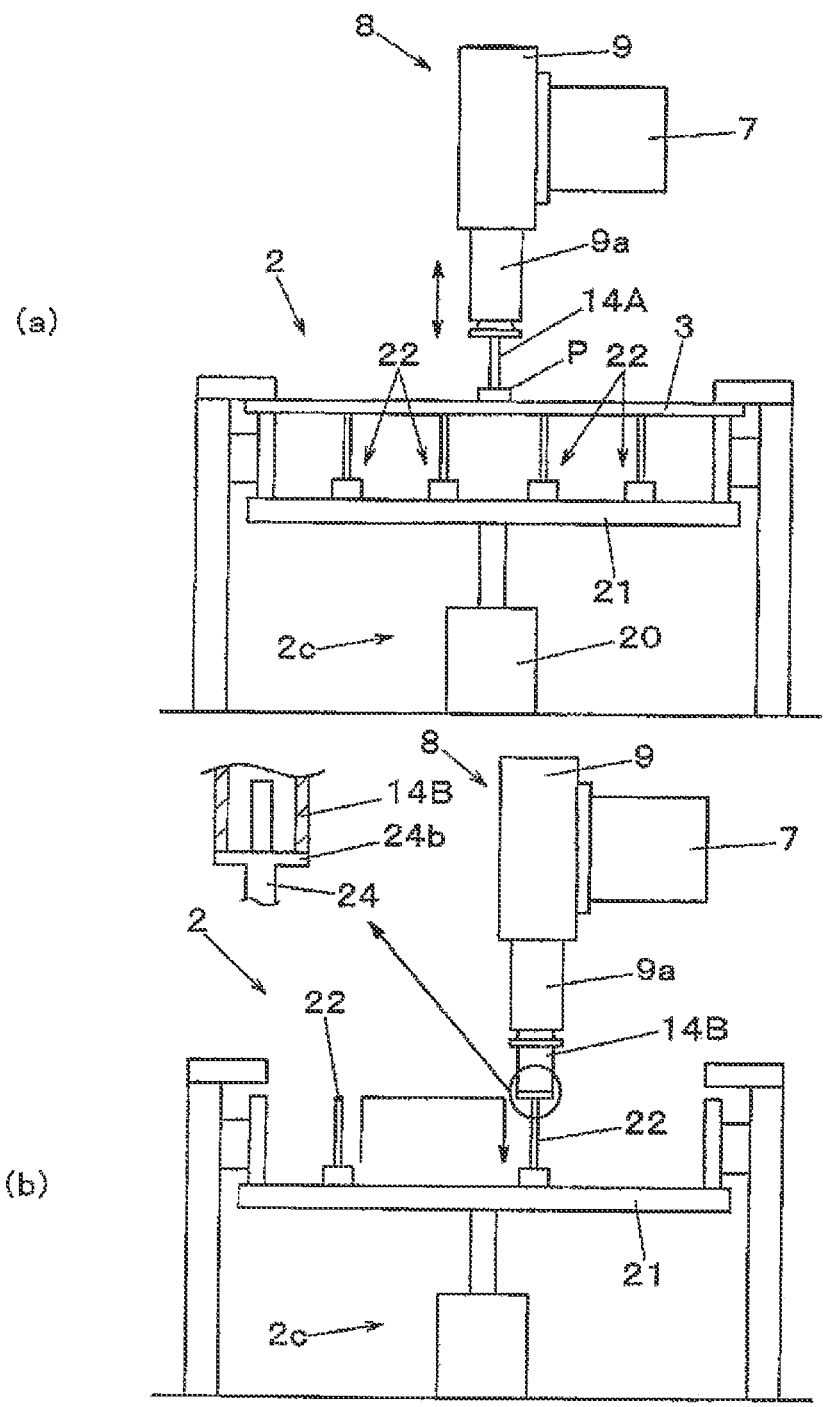
FIG. 3 is drawing in which (a) and (b) explains operation of a mount head in the electronic parts mounting apparatus of the embodiment of the present invention.

(a) in FIG. 3 shows operation for mounting parts on the substrate 3 whose downside is supported by the plurality of lower receiving pins 22 as mentioned above. Specifically, the mount head 8 that has picked up an electronic part P from the parts feed section 4 by the pickup nozzle 14A attached to the nozzle holder 9a is moved to an elevated position above the substrate 3. The unit retaining head 9 performs parts mounting operation for moving up and down the pickup nozzle 14A, whereby the electronic part P is mounted to a mount point on the substrate 3.

In a process of repeatedly performing such parts mounting operation for different types of substrates 3, the arrangement of the lower receiving pins 22 on the lower receiving base 21 is changed. The electronic parts mounting apparatus 1 described in connection with the embodiment automatically performs pin arrangement change work by utilization of the transfer function of the mount head 8. More specifically, as shown in (b) in FIG. 3, the pickup nozzle 14B specifically designed for transferring the lower receiving pin 22 is attached to the nozzle holder 9a of the unit retaining head 9. The pickup nozzle 14B holds by suction the flange 24b provided on the rod-shaped portion 24 of the individual lower receiving pin 22, thereby moving the lower receiving pin 22 to a desired elevated location above the lower receiving base 21.

Figure 4:
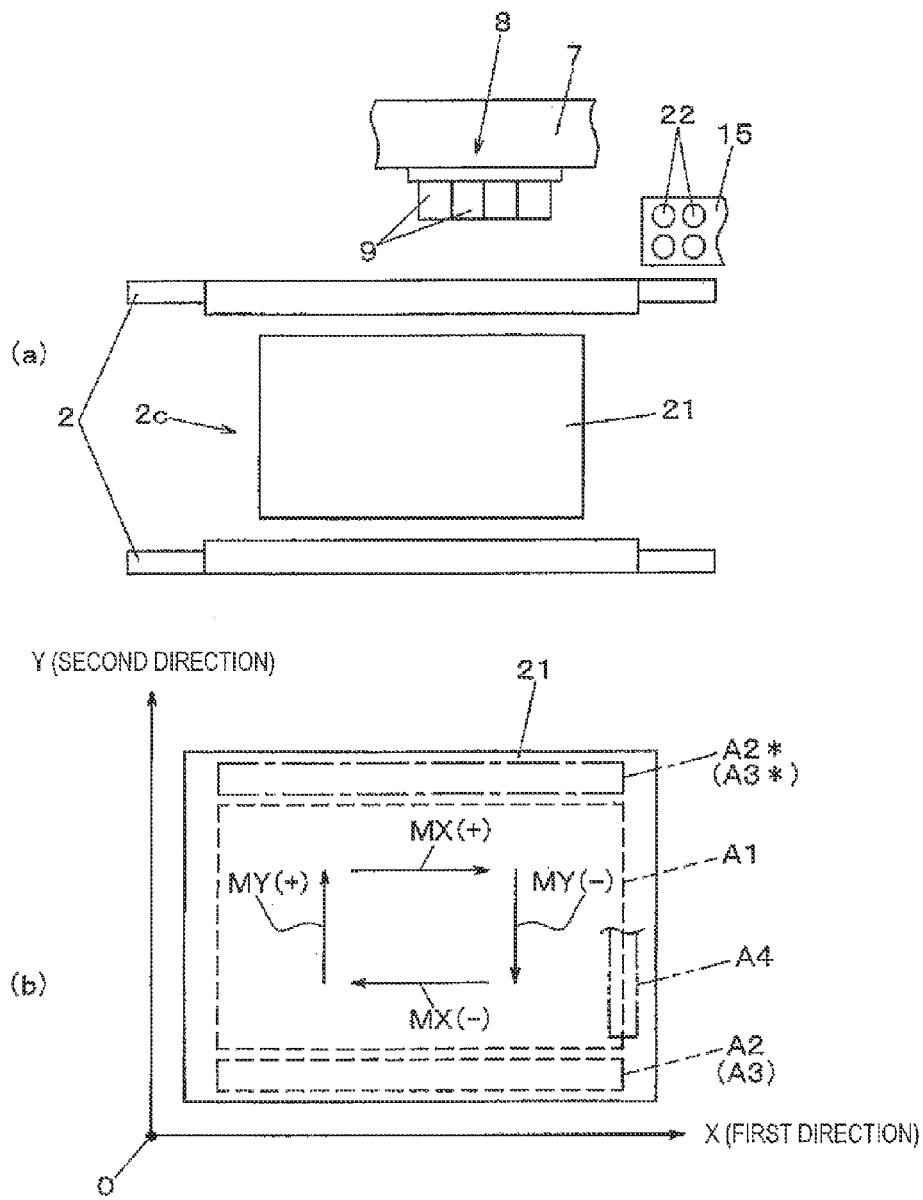
FIG. 4 is plan views in which (a) and (b) are plan views of a lower receiving base in the substrate lower receiving mechanism of the electronic parts mounting apparatus of the embodiment of the present invention.

By reference to (a) and (b) in FIG. 4, there is now described arrangement of the lower receiving pins 22 with respect to the lower receiving base 21 of the substrate lower receiving mechanism 2c in the electronic parts mounting apparatus 1 of the embodiment. As shown in (a) in FIG. 4, in a state in which the substrate 3 is not yet conveyed in the apparatus, a top surface of the lower receiving base 21 of the substrate lower receiving mechanism 2c becomes bare, whereby the mount head 8 becomes able to move the lower receiving pins 22. A pin storage 15 that houses the plurality of lower receiving pins 22 is placed within a movable range of the mount head 8 in the vicinity of the substrate conveyance mechanism 2. The mount head 8 is caused to access the pin storage 15, whereby the unit retaining head 9 can pick up the lower receiving pin 22 and move the thus-picked-up lower receiving pin 22 to the lower receiving base 21.

(b) in FIG. 4 shows split areas of the lower receiving base 21. Set in the lower receiving base 21 is a lower receiving area A1 where the plurality of lower receiving pins 22 for receiving a downside of the substrate 3 are arrayed at arbitrary positions in correspondence to positions for supporting the downside of the target substrate 3. Specifically, the substrate lower receiving mechanism 2c is configured so as to have the lower receiving base 21 on which there is set the lower receiving area A1 where the plurality of lower receiving pins 22 are placed at arbitrary positions.

A pre-array temporary placement area A2 where the lower receiving pins 22 are temporarily placed before being arranged in the lower receiving area A1 is set, while adjoining the lower receiving area A1, along an X direction (a first direction) in the lower receiving base 21 and an edge on a side where a Y-direction coordinate value is small (i.e., on a lower-side edge in (b) in FIG. 4) in a Y direction (a second direction) orthogonal to the X direction. Another pre-array temporary placement area A2* can also be set along an edge on a side where the Y-direction coordinate value is large (i.e., along an upper-side edge in (b) in FIG. 4) in the Y direction. All you need to do is to select either the area A2 or A2*, whichever is convenient for arrangement. The embodiment provides descriptions about an example in which the pre-array temporary placement area A2 is set along the lower-side edge having the small Y-direction coordinate value.

The lower receiving pins 22 picked up from the pin storage 15 by the mount head 8 are temporarily placed in the pre-array temporary placement area A2. The mount head 8 moves the lower receiving pins 22 temporarily arrayed in the pre-array temporary placement area A2 to array positions that correspond to the positions where the downside of the target substrate 3 is to be received. Therefore, the mount head 8 and the foregoing head moving mechanism make up temporary pin storage means for temporarily storing the lower receiving pins 22 in the pre-array temporary placement area A2, as well as making up pin arranging means for arranging the lower receiving pins 22 temporarily placed in the pre-array temporary placement area A2 to the lower receiving area A1.

The pre-array temporary placement area A2 (A2*) in the embodiment doubles also as a post-return temporary placement area A3 (A3*) where the plurality of lower receiving pins 22 are returned and temporarily placed after being arranged in the lower receiving area A1 and used for receiving the downside of the substrate 3. Specifically, the post-return temporary placement area A3 is set in the lower receiving base 21 along the X direction (the first direction) and the edge on the side where the Y-direction coordinate value is small (i.e., along the lower-side edge in (b) in FIG. 4) along the Y direction (the second direction) orthogonal to the X direction. The post-return temporary placement area A3* is set on the side where the Y-direction coordinate value is large (i.e., along the upper-side edge in (b) in FIG. 4). Alternatively, the pre-array temporary placement area A2 (A2*) and the post-return temporary placement area A3 (A3*) can also be set individually as independent temporary placement areas.

The lower receiving pins 22 arranged and used in the lower receiving area A1 are moved by the mount head 8 to corresponding temporary placement positions within the post-return temporary placement area A3. Therefore, the mount head 8 and the head moving mechanism also double as returned pin temporary placing means, that temporarily places the lower receiving pins 22 in the post-return temporary placement area A3 where the plurality of lower receiving pins 22 returned after being arranged in the lower receiving area A1 are temporarily placed.

Not all of the lower receiving pins 22 temporarily placed in the pre-array temporary placement area A2 are necessarily arranged in the lower receiving area A1 and used for receiving the downside of the substrate at all times. There arise cases where some of the temporarily arranged lower receiving pins 22 become redundant depending on a substrate type. In the embodiment, there is set a pin-passing area A4 where redundant pins stay in order to avoid interfering with an actual substrate. On the occasion of arranging lower receiving pins to the lower receiving area A1, work for moving the redundant pins to the pin-passing area A4 is performed.

As shown in (b) in FIG. 4, individual transfer operation by which the pin arranging means and the returned pin temporary placing means individually transfer the lower receiving pin 22 is implemented by a combination of at least two of four types of transfer operations that are parallel to the two coordinate axes X and Y and in mutually opposite directions. Specifically, the transfer operation is implemented by an appropriate combination of at least two of a first positive transfer operation MX(+) for transferring a pin in a positive direction along the X direction (the first direction), a first negative transfer operation MX(−) for transferring a pin in a negative direction along the X direction or a second positive transfer operation MY(+) for transferring a pin in the positive direction along the Y direction (the second direction) orthogonal to the first direction, and a second negative transfer operation MY(−) for moving a pin in a negative direction along the Y direction.

By reference to (a) and (b) in FIG. 5, explanations are now given to positions in the lower receiving area A1 set on the lower receiving base 21 where the lower receiving pins 22 are to be arranged and positions in the pre-array temporary placement area A2 (the post-return temporary placement area A3) where the lower receiving pins 22 are to be temporarily placed. (a) in FIG. 5 shows an example of positions in the lower receiving area A1 where the lower receiving pins 22 are to be arranged. In this example, array positions AP1 to AP7 used for arranging seven lower receiving pins 22 are set according to positions where a downside of the target substrate 3 is to be received. Each of the array positions AP is specified by a combination of any one of coordinate values x1 to x7 of the X direction (the first direction) with any one of coordinate values y1 to y7 of the Y direction (the second direction). In the example, the following magnitude relations exist in these coordinate values; namely, $$x1<x2<x3<x4<x5<x6(=x7)$$

$$y1>y3(=y5)>y6>y4>y2>y7$$

(b) in FIG. 5 shows an example of temporary placement positions for the lower receiving pins 22 in the pre-array temporary placement area A2 (the post-return temporary placement area A3). In this example, a plurality of (10 in the embodiment) temporary placement positions TP1 to TP10 are set in a row, in an increasing sequence of distance from the origin O of coordinates along the X direction (a first direction), in the pre-array temporary placement area A2 (the post-return temporary placement area A3) and in accordance with the number of the lower receiving pins 22 queuing in the pre-array temporary placement area A2.

In the embodiment, assignment of temporary placement positions and setting of a transfer sequence are performed before transfer of the lower receiving pins 22 in the pre-array temporary placement area A2 and return of the arranged-and-used lower receiving pins 22 from the lower receiving area A1. Assignment of the temporary placement positions corresponds to determining a correlation among the lower receiving pins 22 to be arranged at the array positions AP1 to AP7, the temporary placement positions TP4 to TP10 where the lower receiving pins 22 are temporarily placed, and the temporary placement positions TP1 to TP3 where redundant lower receiving pins 22, which are not actually used for receiving and transferred to the pin-passing area A4, are temporarily placed. The transfer sequence determines a sequence of transfer of the lower receiving pins 22. Setting assignment of temporary placement positions and the transfer sequence is intended to prevent the lower receiving pins 22, which have been arranged in the lower receiving area A1 during performance of pin transfer operation, from interfering with the lower receiving pin 22 being transferred.

Figure 6:
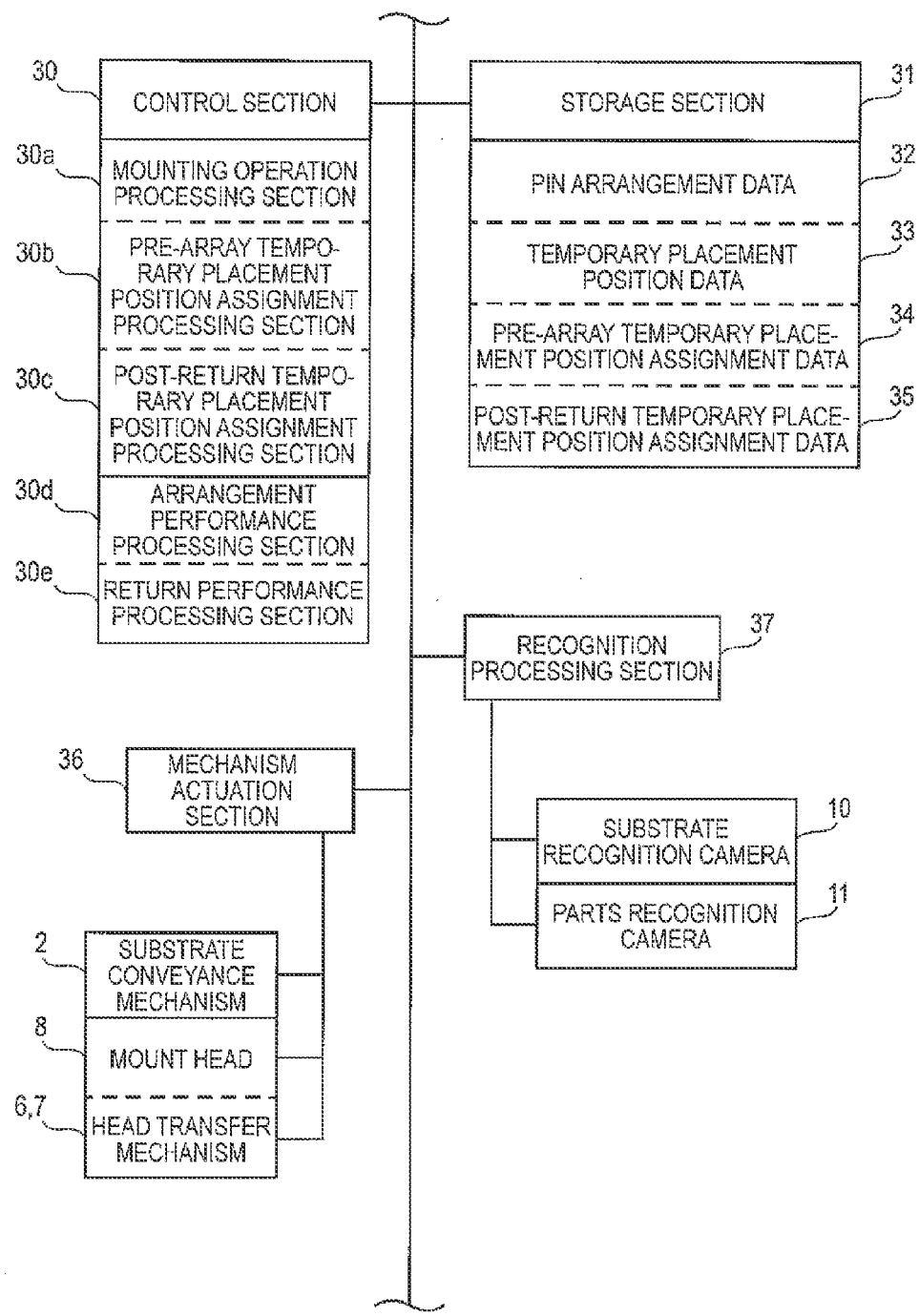
FIG. 6 is a block diagram showing a configuration of a control system of the electronic parts mounting apparatus of the embodiment of the present invention.

By reference to FIG. 6, a configuration of a control system is now described. A control section 30 controls respective sections of the electronic parts mounting apparatus 1 in accordance with various types of programs and data stored in a storage section 31, thereby performing work for mounting electronic parts on the target substrate 3. The control section 30 has, as internal control processing functions, a mounting operation processing section 30a, a pre-array temporary placement position assignment processing section 30b, a post-return temporary placement position assignment processing section 30c, an arrangement performance processing section 30d, and a post-return performance processing section 30e.

In addition to storing mount data for each substrate 3, the storage section 31 stores pin arrangement data 32, temporary placement position data 33, pre-array temporary placement position assignment data 34, and post-return temporary placement position assignment data 35. The pin arrangement data 32 are data pertinent to the array positions AP of the lower receiving pins 22 in the lower receiving area A1 shown in (a) in FIG. 5 and positions in the pin-passing area A4 where redundant lower receiving pins are to be transferred. The temporary placement position data 33 are data pertinent to the temporary placement positions TP in the pre-array temporary placement area A2 (the post-return temporary placement area A3) shown in (b) in FIG. 5 where the lower receiving pins 22 are temporarily placed.

The mount operation processing section 30a performs processing for controlling operation intended to mount to the substrate 3 an electronic part P picked up from the parts feed section 4 by the mount head 8. On the basis of the pin arrangement data 32 and the temporary placement position data 33, the pre-array temporary placement position assignment processing section 30b performs processing for individually assigning the plurality of lower receiving pins 22 arranged in the lower receiving area A1 to the respective temporary placement positions TP that are ordered, in the pre-array temporary placement area A2, in increasing sequence of distance from the origin O of coordinates along the X direction. A result of processing performance is stored in the storage section 31 as the pre-array temporary placement position assignment data 34. Likewise, on the basis of the pin arrangement data 32 and the temporary placement position data 33, the post-return temporary placement position assignment processing section 30c performs processing for individually assigning the plurality of lower receiving pins 22 to be returned to the respective temporary placement positions TP that are ordered, in the post-return temporary placement area A3, in increasing sequence of distance from the origin O of coordinates along the X direction. A result of processing performance is stored in the storage section 31 as the post-return temporary placement position assignment data 35.

On the basis of the pre-array temporary placement position assignment data 34, the arrangement performance processing section 30d performs processing for sequentially transferring the plurality of lower receiving pins 22 temporarily placed in the pre-array temporary placement area A2 to the corresponding array positions AP within the lower receiving area A1. The return performance processing section 30e performs processing for sequentially transferring the plurality of lower receiving pins 22 placed in the lower receiving area A1 to the respective temporary placement positions TP in the post-return temporary placement area A3.

Under control of the control section 30, a mechanism actuation section 36 actuates the head moving mechanism made up of the substrate conveyance mechanism 2, the mount head 8, the Y-axis movable table 6, and the X-axis movable tables 7. Operation for mounting electronic parts to the substrate 3 and operation for changing the arrangement of the lower receiving pins 22 in the substrate lower receiving mechanism 2c of the substrate conveyance mechanism 2 are thereby performed. A recognition processing section 37 subjects imaging results of the substrate recognition camera 10 and the parts recognition camera 11 to recognition processing. By the operation for mounting electronic parts on the substrate 3, corrections are made to positional errors detected from the recognition processing results.

By reference to (a) and (b) in FIG. 5 and (a) in FIG. 7, explanations are now given to an actual example of temporary placement position assignment processing performed by the pre-array temporary placement position assignment processing section 30b. (a) in FIG. 7 shows the pre-array temporary placement position assignment data 34 corresponding to the pin arrangement in the lower receiving area A1 shown in (a) in FIG. 5 and the pin arrangement in the pin-passing area A4 shown in (b) in FIG. 4. The temporary placement positions TP10 to TP4 shown in the temporary placement position field 34b are brought in correspondence to the array positions AP1 to AP7 shown in an array position field 34a, respectively. Further, the temporary placement positions TP3 to TP1 are brought in correspondence to the pin-passing area A4. Further, a sequence of transfer of individual lower receiving pins 22 is defined by setting a transfer performance sequence 34c. The pre-array temporary placement position assignment processing section 30b brings a sequence in which the temporary placement positions TP are located more distant from the origin O of coordinates, in correspondence to a sequence in which the X-direction coordinate values "x" of the array positions AP for the lower receiving pins 22 to be arranged in the lower receiving area A1 become smaller, thereby assigning the temporary placement positions TP.

In the specific example, the pin-passing area A4 corresponding to the largest X-direction coordinate value is assigned to the temporary placement positions TP1 through TP 3 located closest to the origin O of coordinates. Next, either an array position AP6 or AP7 corresponding to the second largest X-direction coordinate value x6 or x7 (x6=x7) is assigned to the temporary placement position TP4 located closest, second to the three temporary placement positions, to the origin O of coordinates. In the embodiment, the array position AP7 that has a smaller Y-direction coordinate value is preferentially assigned to the temporary placement position TP4, and the array position AP6 is assigned to the temporary placement position TP5.

Specifically, when there are a plurality of array positions AP (the array positions AP6 and AP7 in the embodiment) having the same X-direction (first-direction) coordinate value, temporary placement positions are brought in correspondence to the array positions AP in increasing sequence of a Y-direction (second-direction) coordinate value "y" during pre-array temporary placement position assignment. Next, the array position AP5 is assigned to the temporary placement position TP6. Likewise, the array positions AP4 to AP1 ordered in decreasing sequence of X-direction coordinate value are assigned to the respective temporary placement positions TP7 to TP10 located in increasing sequence of distance from the origin O of coordinates.

The transfer performance sequence 34c is next set. In the sequence, the lower receiving pins 22 at the array positions AP ordered in decreasing sequence of X-direction coordinate value "x" are transferred in turn. Specifically, the lower receiving pins 22 at the temporary placement positions TP1 to TP3 assigned so as to be transferred to the pin-passing area A4 are first set as transfer targets (1), (2), and (3), respectively. Next, a transfer performance sequence (4) to (10) is set in such a way that the lower receiving pins 22 at the temporary placement positions TP4 to TP10 are transferred to the array positions AP7 to AP1, respectively. On the occasion of performing arrangement of the lower receiving pins 22, the arrangement performance processing section 30d performs transfer of the lower receiving pins 22 in accordance with the transfer performance sequence 34c represented by the pre-array temporary placement position assignment data 34.

By reference to (a) and (b) in FIG. 5 and (b) in FIG. 7, there is now described an actual example of temporary placement position assignment processing performed by the post-return temporary placement position assignment processing section 30c. (b) in FIG. 7 shows the post-return temporary placement position assignment data 35 corresponding to the pin arrangement in the lower receiving area A1 shown in (a) in FIG. 5. Even in this case, the temporary placement positions TP10 to TP4 shown in a temporary placement position field 35b are brought in correspondence to the array positions AP1 to AP7 shown in an array position field 35a as in the case with the pre-array temporary placement position assignment data 34, and the temporary placement positions TP3 to TP1 are brought in correspondence to the pin-passing area A4. A transfer sequence of the individual lower receiving pin 22 is defined by setting a transfer performance sequence 35c. As in the case of the pre-array temporary placement position assignment processing section 30b, the post-return temporary placement position assignment processing section 30c brings a sequence in which the temporary placement positions TP are located more distant from the origin O of coordinates, in correspondence to a sequence in which the X-direction coordinate values "x" of the array positions AP of the lower receiving pins 22 to be arrange become smaller, thereby assigning the temporary placement positions TP.

In the specific example, the pin-passing area A4 corresponding to the largest X-direction coordinate value is assigned to the temporary placement positions TP1 through TP 3 located closest to the origin O of coordinates. Next, either the array position AP6 or AP7 corresponding to the second largest X-direction coordinate value x6 or x7 (x6=x7) is assigned to the temporary placement position TP4 that is closest, second to the three temporary placement positions, to the origin O of coordinates. In the embodiment, the array position AP7 that has a smaller Y-direction coordinate value is preferentially assigned to the temporary placement position TP4, and the array position AP6 is assigned to the temporary placement position TP5.

Specifically, when there are a plurality of array positions AP (the array positions AP6 and AP7 in the embodiment) having the same X-direction (first-direction) coordinate value, temporary placement positions are brought in correspondence to the array positions AP in increasing sequence of a Y-direction (second-direction) coordinate value "y" during pre-array temporary placement position assignment. Next, the array position AP5 is assigned to the temporary placement position TP6. Likewise, the array positions AP4 to AP1 ordered in decreasing sequence of X-direction coordinate value are assigned to the respective temporary placement positions TP7 to TP10 located in increasing order of distance from the origin O of coordinates.

The transfer performance sequence 35c is next set. In the sequence, the lower receiving pins 22 at the array positions AP ordered in increasing sequence of X-direction coordinate value "x" are transferred in turn. Specifically, a transfer performance sequence (1) to (7) is first set in such a way that the lower receiving pins 22 at the array positions AP1 to AP7 ordered in increasing sequence of X-direction coordinate value are transferred in turn to the temporary placement positions TP10 to TP4 located in decreasing sequence of distance from the origin O of coordinates. Next, a transfer performance sequence (8) to (10) is set in such a way that the lower receiving pins 22 in the pin-passing area A4 are transferred to the temporary placement positions TP3 to TP1, respectively. On the occasion of performing operation for returning the lower receiving pins 22, the return performance processing section 30e performs transfer of the lower receiving pins 22 in accordance with the transfer performance sequence 35c represented by the post-return temporary placement position assignment data 35.

Figure 8:
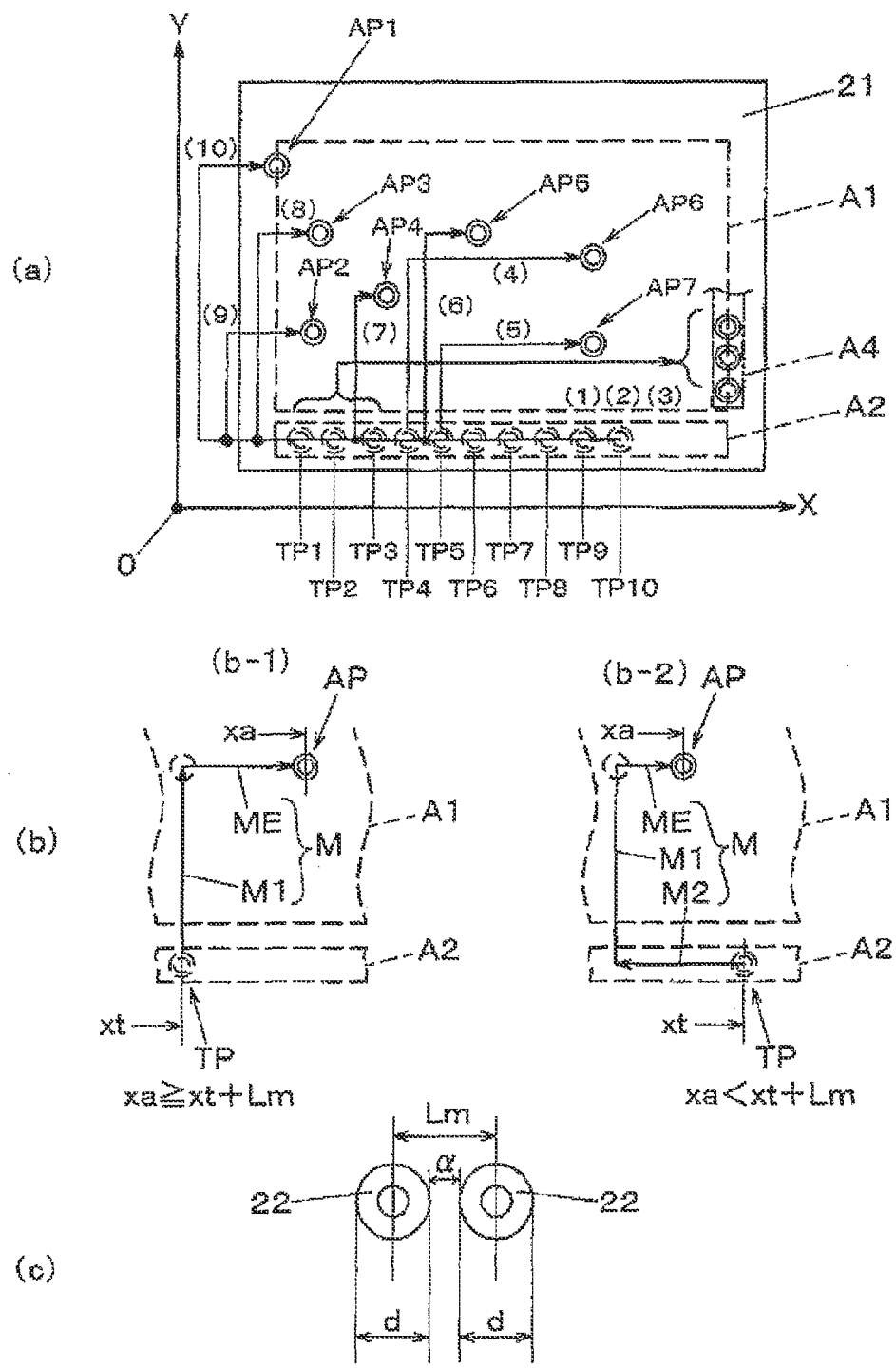
FIG. 8 is view in which (a) to (c) are explanatory views of operation pertinent to a lower receiving pin arrangement method in the electronic parts mounting apparatus of the embodiment of the present invention.

By reference to (a) to (c) in FIG. 8 and (a) and (b) in FIG. 9, and drawings, explanations are now given to, in connection with the electronic parts mounting apparatus 1, a lower receiving pin arrangement method for arranging the plurality of lower receiving pins 22 that receive and support the downside of the substrate 3 to arbitrary positions on the lower receiving area A1 set in the lower receiving base 21 and the lower receiving pin return method for picking up and returning the lower receiving pins from the lower receiving area A1.

First, prior to performance of the above work operation, the pre-array temporary placement position assignment processing section 30b generates the pre-array temporary placement position assignment data 34 shown in (a) in FIG. 7 (a pre-array temporary placement position assignment step), and the post-return temporary placement position assignment processing section 30c generates the post-return temporary placement position assignment data 35 shown in (b) in FIG. 7 (a post-return temporary placement position assignment step). The thus-generated pre-array temporary placement position assignment data 34 and the thus-generated post-return temporary placement position assignment data 35 are stored in the storage section 31. In the pre-array temporary placement position assignment step and the post-return temporary placement position assignment step, a sequence in which the temporary placement positions TP become more distant from the origin O of coordinates is brought into correspondence to a sequence in which the X-direction coordinate values "x" of the array positions AP for the plurality of lower receiving pins 22 to be arranged or returned become smaller, thereby performing assignment.

Subsequently, as prearrangement for pin arrangement operation, a required number of lower receiving pins 22 in the pin storage 15 shown in FIG. 4(a) are transferred to the temporary placement positions TP set in the pre-array temporary placement area A2 on the lower receiving base 21 by the mount head 8. Incidentally, when the required number of lower receiving pins 22 have already been put in the pre-array temporary placement area A2 by stage replacement work in association with a change in substrate type or pin arrangement work, transfer of new lower receiving pins 22 is not necessary.

Subsequently, by reference to the pre-array temporary placement position assignment data 34, the arrangement performance processing section 30d transfers the plurality of lower receiving pins 22 temporarily placed at the temporary placement positions TP10 to TP1 assigned to the pre-array temporary placement area A2, in turn to the array positions AP7 to AP1 of the lower receiving area A1 and the pin-passing area A4 by the mount head 8 (an arrangement performance step). In the arrangement performance step, the lower receiving pins 22 at the array positions AP ordered in decreasing sequence of X-direction coordinate value "x" are transferred in turn.

Specifically, as shown in (a) in FIG. 8, the three lower receiving pins 22 temporarily placed, in order of (1) to (3), in the temporary placement positions TP1 to TP3 are first transferred in turn to the pin-passing area A4 having the largest X-direction coordinate value. Next, the lower receiving pins 22 temporarily placed in the temporary placement positions TP4 and TP5 are transferred, in order of (4) and (5), to the array positions AP6 and AP7 that have the second largest X-direction coordinate value. The lower receiving pins 22 temporarily placed in the temporary placement positions TP6 and TP7 are then transferred, in order of (6) and (7), to the array positions AP5 and AP4, respectively. The lower receiving pins 22 temporarily placed in the temporary placement positions TP7 to TP10 are next transferred, in order of (7) to (10), to the array positions AP4 to AP1, respectively, whereupon pin arrangements shown in FIG. 5(a) are thus completed.

By reference to (b) in FIG. 8, explanations are now given to a detailed pattern of individual transfer operation to be performed for the respective lower receiving pins 22 in which the lower receiving pins 22 at the array positions AP ordered in decreasing sequence of X-direction coordinate value "x" are individually transferred in turn in the arrangement performance process. As shown in (b) in FIG. 4, the individual transfer operation is implemented by an appropriate combination of at least two of the first positive transfer operation MX(+), the first negative transfer operation MX(−), the second positive transfer operation MY(+), and the second negative transfer operation MY(−). However, in examples shown in FIGS. 8(a) to (c), the pre-array temporary placement area A2 is set beneath the lower receiving area A1 of the lower receiving base 21; hence, only the second positive transfer operation MY(+) appears with regard to transfer in the Y direction. In the embodiment, the operation patterns are set such that final transfer operation ME by which the lower receiving pin 22 reaches the array position AP in the individual transfer operation M comes to be the first positive transfer operation MX(+).

First, reference symbol (b-1) in (b) in FIG. 8 designates an operation pattern applied to individual transfer operation M defined by a transfer performance sequence of (1), (2), (3), (4), and (5) in (a) in FIG. 8. The operation pattern is applied to a case where the temporary placement position TP is located closer to the origin of coordinates in the X direction with respect to the corresponding array position AP and where there is fulfilled a requirement of the lower receiving pin 22 being able to be transferred without interfering with other lower receiving pins 22 already arranged in the lower receiving area A1 even when transferred from the temporary placement position TP directly to the positive side in the Y direction.

Specifically, when an X-direction coordinate value xa of the array position AP is larger than an X-direction coordinate value xt of the temporary placement position TP by a predetermined margin value Lm shown in (c) in FIG. 8 or more (xa≥xt+Lm), advanced transfer operation M1 is implemented in advance of the final transfer operation ME by the individual transfer operation M targeted for the lower receiving pin 22. Since the pre-array temporary placement area A2 is set beneath the lower receiving area A1, the advanced transfer operation M1 comes to be the second positive transfer operation MY(+). In the meantime, when the pre-array temporary placement area A2 is set above the lower receiving area A1, the advanced transfer operation M1 comes to be the second negative transfer operation MY(−).

As shown in (c) in FIG. 8, the margin value Lm is set by adding allowance α for avoiding occurrence of interference between pins without fail to a diameter "d" of the lower receiving pin 22. By setting such a margin value Lm, when transferred from the pre-array temporary placement area A2 to the lower receiving area A1 by the second positive transfer operation MY(+), the lower receiving pin 22 does not interfere with the lower receiving pins 22 already arranged. Specifically, the lower receiving pins 22 at the array positions AP ordered in decreasing sequence of X-direction coordinate value "x" are transferred in turn in the embodiment. Therefore, there are not any existing lower receiving pins 22 in the area closer to the origin of coordinates except the lower receiving pin 22 that is a target of transfer in the individual transfer operation. Consequently, occurrence of interference with all of the existing lower receiving pins 22 can be thoroughly prevented, so long as the operation pattern is set so as to prevent occurrence of interference with the lower receiving pin 22 that is a target of transfer.

Next, reference symbol (b-2) in (b) in FIG. 8 designates an operation pattern applied to individual transfer operation defined by a transfer performance sequence of (6), (7), (8), (9), and (10) in (a) in FIG. 8. The operation pattern is applied to a case where the temporary placement position TP is located on the other side of the origin of coordinates in the X direction with respect to the corresponding array position AP or where the lower receiving pin 22 located in an area closer to the origin of coordinates may interfere with the lower receiving pins 22 already arranged in the lower receiving area A1 when transferred from the temporary placement position TP directly to the positive side in the Y direction. In this case, once the lower receiving pin 22 has been transferred toward the origin of coordinates (i.e., toward the negative side in the X direction) in the pre-array temporary placement area A2 to eliminate the possibility of interference with the existing lower receiving pins 22, the lower receiving pin 22 is transferred to the array position AP in the lower receiving area A1.

Specifically, when the X-direction coordinate value xa of the array position AP is smaller than a limit value determined by adding a predetermined margin value Lm to the X-direction coordinate value xt of the temporary placement position TP (xa<xt+Lm), the advanced transfer operations M1 and M2 are performed prior to the final transfer operation ME by the individual transfer operation M targeted for the lower receiving pin 22. Since the pre-array temporary placement area A2 is set beneath the lower receiving area A1, the advanced transfer operation M1 comes to be the second positive transfer operation MY(+). The advanced transfer operation M2 that has been performed before the advanced transfer operation M1 comes to be the first negative transfer operation MX(−). When the pre-array temporary placement area A2 is set above the lower receiving area A1, the advanced transfer operation M1 comes to be the second negative transfer operation MY(−).

Subsequently, parts mounting operation is carried out while the downside of the substrate 3 is received by the plurality of lower receiving pins 22 arranged in conformance with the pin arrangement. If production of a predetermined number of lots is completed, return operation for transferring the lower receiving pins 22 arranged in the lower receiving area A1 to the post-return temporary placement area A3 is performed in order to change the current pin arrangement to another pin arrangement appropriate for a new substrate 3.

More specifically, the return performance processing section 30e transfers in turn, by reference to the post-return temporary placement position assignment data 35, the plurality of lower receiving pins 22 arranged in the lower receiving area A1 to the temporary placement positions TP assigned to the post-return temporary placement area A3 (a return performance step). In the return performance step, the lower receiving pins 22 at the array positions AP ordered in increasing sequence of X-direction coordinate value "x" are transferred in turn.

As shown in (a) in FIG. 9, the lower receiving pin 22 at the array position AP1 having the smallest X-direction coordinate value is first transferred to the temporary placement position TP10. Next, the lower receiving pins 22 arranged at the array positions AP2, AP3, AP4, and AP5 ordered in increasing sequence of X-direction coordinate value are transferred, in turn, to the temporary placement positions TP9, TP8, TP7, and TP6. The lower receiving pins 22 arranged at the array positions AP7 and AP6 are transferred to the temporary placement positions TP5 and TP4 in turn. Thereafter, the three lower receiving pins 22 situated in the pin-passing area A4 are transferred to the temporary placement positions TP3, TP2, and TP1 in turn, whereupon return operation ends.

Next, by reference to (b) in FIG. 9, explanations are now given to a detailed pattern of individual transfer operation to be performed for the respective lower receiving pins 22 in which the lower receiving pins 22 at the array positions AP ordered in increasing sequence of X-direction coordinate value "x" are individually transferred in turn in the return performance process. As shown in (b) in FIG. 4, the individual transfer operation M is implemented by an appropriate combination of at least two of the first positive transfer operation MX(+), the first negative transfer operation MX(−), the second positive transfer operation MY(+), and the second negative transfer operation MY(−). However, in examples shown in (a) and (b) in FIG. 9, the post-return temporary placement area A3 is set beneath the lower receiving area A1 of the lower receiving base 21; hence, only the second negative transfer operation MY(−) appears with regard to transfer in the Y direction. In the embodiment, the operation patterns are set such that transfer initiation operation MS by which the lower receiving pin 22 moves away from the array position AP in the individual transfer operation M comes to be the first negative transfer operation MX(−).

First, reference symbol (b-1) in (b) in FIG. 9 designates an operation pattern applied to individual transfer operation M defined by a transfer performance sequence of (6), (7), (8), (9), and (10) in (a) in FIG. 9. The operation pattern is applied to a case where the temporary placement position TP is located closer to the origin of coordinates in the X direction with respect to the corresponding array position AP and where there is fulfilled a requirement of the lower receiving pin 22 being able to be transferred without interfering with other lower receiving pins 22 already arranged in the lower receiving area A1 even when the lower receiving pin 22 which has already been transferred from the array position AP to the negative side in the X direction by the transfer initiation operation MS is transferred directly to the negative side in the Y direction.

Specifically, when an X-direction coordinate value xa of the array position AP is larger than the X-direction coordinate value xt of the temporary placement position TP by a predetermined margin value Lm described in connection with (c) in FIG. 8 or more (xa≥xt+Lm), succeeding transfer operation M*1 is implemented subsequently to the transfer initiation operation MS by the individual transfer operation M targeted for the lower receiving pin 22. When the post-return temporary placement area A3 is set beneath the lower receiving area A1, the succeeding transfer operation M*1 comes to be the second negative transfer operation MY(−). In the meantime, when the post-return temporary placement area A3 is set above the lower receiving area A1, the succeeding transfer operation M'*1 comes to be the second positive transfer operation MY(+).

By setting the operation pattern in consideration of such a margin value Lm, when transferred from the lower receiving area A1 to the pre-array temporary placement area A2 by the second negative transfer operation MY(−), the lower receiving pin 22 does not interfere with the lower receiving pins 22 already arranged. Specifically, the lower receiving pins 22 at the array positions AP ordered in increasing sequence of X-direction coordinate value "x" are transferred in turn in the embodiment. Therefore, the existing lower receiving pins 22 have already been transferred and are not present in the lower receiving area A1 on the part of the origin of coordinates except the lower receiving pin 22 that is a target of transfer in the individual transfer operation. Consequently, occurrence of interference with all of the existing lower receiving pins 22 can be thoroughly prevented, so long as the operation pattern is set so as to prevent occurrence of interference with the lower receiving pin 22 that is a target of transfer.

Next, reference symbol (b-2) in (b) in FIG. 9 designates an operation pattern applied to individual transfer operation defined by a transfer performance sequence of (1), (2), (3), (4), and (5) in (a) in FIG. 9. The operation pattern is applied to a case where the temporary placement position TP is located on the other side of the origin of coordinates in the X direction with respect to the corresponding array position AP or where, although the temporary placement position TP is located on the part of the origin of coordinates with respect to the array position AP, the lower receiving pin 22 which has been transferred from the array position AP to the negative side in the X direction by the transfer initiation operation MS may interfere with the lower receiving pins 22 already arranged in the lower receiving area A1 when transferred directly to the negative side in the Y direction. In this case, once the lower receiving pin 22 has been transferred from the array position AP to the negative side in the X direction by the transfer initiation operation MS to eliminate the possibility of interference with the existing lower receiving pins 22, the lower receiving pin 22 is transferred to the position of the post-return temporary placement area S3 toward the negative side in the Y direction (the succeeding transfer operation M*1), and the lower receiving pin 22 is then transferred to a predetermined temporary placement position TP in the post-return temporary placement area A3 toward the positive side in the X direction (the succeeding transfer operation M*2).

Specifically, when the X-direction coordinate value xa of the array position AP is smaller than the limit value determined by adding the predetermined margin value Lm to the X-direction coordinate value xt of the temporary placement position TP (xa<xt+Lm), the succeeding transfer operations M*1 and M*2 are performed subsequently to the transfer initiation operation MS by the individual transfer operation targeted for the lower receiving pin 22. Since the post-return temporary placement area A3 is set beneath the lower receiving area A1, the succeeding transfer operation M*1 comes to be the second negative transfer operation MY(−). The succeeding transfer operation M*2 that is performed subsequently to the succeeding transfer operation M*1 comes to be the first positive transfer operation MX(+). When the post-return temporary placement area A3 is set above the lower receiving area A1, the succeeding transfer operation M*1 comes to be the second positive transfer operation MY(+).

As descried above, under the lower receiving pin arrangement method and the lower receiving pin return method described in connection with the embodiment, the pre-array temporary placement area A2 where the plurality of lower receiving pins 22 are temporarily placed before being arranged and the post-return temporary placement area A3 where the plurality of returned lower receiving pins 22 are temporarily placed are set, along with the lower receiving area A1 where the lower receiving pins 22 are to be arranged at arbitrary positions, in the lower receiving base 21 of the substrate lower receiving mechanism 2c. The temporary placement positions TP for the lower receiving pins 22 in the pre-array temporary placement area A2 and the post-return temporary placement area A3 are previously assigned in consideration of the requirements for preventing occurrence of interference between pins, which would otherwise be caused in the middle of transfer of the lower receiving pin 22, according to the array positions AP of the lower receiving pins 22 in the lower receiving area A1.

Specifically, the final transfer operation ME in which the lower receiving pin 22 reaches the array position AP by the individual transfer operation M intended for transferring in turn the lower receiving pins 22 at the array positions AP ordered in decreasing sequence of first-direction coordinate value "x" is implemented, as the first positive transfer operation MX(+) in which transfer is carried out in the positive direction along the first direction, in the arrangement performance step of transferring the lower receiving pin 22 from the pre-array temporary placement area A2 which is set in the lower receiving base 21 along the first direction and where the plurality of lower receiving pins 22 are temporarily placed before arranged to thereby arrange the thus-transferred lower receiving pin 22 at the array position AP in the lower receiving area A1. Further, the transfer initiation operation MS for transferring the lower receiving pin 22 from the array position AP by the individual transfer operation M intended for transferring in turn the lower receiving pins 22 at the array positions AP ordered in decreasing sequence of first-direction coordinate value "x" is taken, as the first negative transfer operation MX(−) for transferring the lower receiving pin 22 toward the negative side along the first direction, in the return performance step of transferring in turn the plurality of lower receiving pins 22 arranged at the array positions AP in the lower receiving base 21 to the post-return temporary placement area A3.

Interference of lower receiving pins during transfer, which would otherwise occur in the arrangement performance step of arranging the lower receiving pin 22 to the lower receiving area A1 and the return performance step of returning the lower receiving pin 22 from the lower receiving area A1, can be effectively prevented. In particular, under the technique for arranging the lower receiving pins 22 at arbitrary positions in the lower receiving base 21, even when interference is likely to occur during transfer of a pin as a result of spacing between pins having become narrow, occurrence of interference of pins, which would otherwise occur during transfer, can be prevented without fail by appropriately setting a transfer path and sequence of the lower receiving pins 22.

In the related art, there are inconveniences attributable to a pin transfer mode adopted to prevent interference between lower receiving pins, i.e., setting an elevation stroke employed for transferring a pin to a height of the lower receiving pin or more. For instance, excessive setting of a transfer head stroke incurs an increase in equipment cost. Further, a tact loss is caused by a delay in operation time associated with an increase in elevation stroke. These problems are prevented, and work for arranging and returning the lower receiving pins 22 can be made efficient.

The patent application is based on Japanese Patent Application (JP-2012-020567) filed on Feb. 2, 2012, the subject matter of which is incorporated herein by reference in its entirety.

INDUSTRIAL APPLICABILITY

The lower receiving pin arrangement method and the lower receiving pin return method of the present invention yield an advantage of the ability to make work for arranging and returning the lower receiving pin efficient and are useful in an electronic parts mounting field in which electronic parts are mounted on a substrate whose downside is supported by a plurality of lower receiving pins.

DESCRIPTIONS OF THE REFERENCE NUMERALS AND SYMBOLS

1 ELECTRONIC PARTS MOUNTING APPARATUS
2 SUBSTRATE CONVEYANCE MECHANISM
2c SUBSTRATE LOWER RECEIVING MECHANISM
3 SUBSTRATE

8 MOUNT HEAD
9 UNIT RETAINING HEAD
9a NOZZLE HOLDER
14A, 14B PICKUP NOZZLE
21 LOWER RECEIVING BASE
21a MAGNETIC SUBSTANCE
22 LOWER RECEIVING PIN
A1 LOWER RECEIVING AREA
A2 PRE-ARRAY TEMPORARY PLACEMENT AREA
A3 POST-RETURN TEMPORARY PLACEMENT AREA
AP, AP1 TO AP7 ARRAY POSITION
TP, TP1 TO TP10 TEMPORARY PLACEMENT POSITION
M INDIVIDUAL TRANSFER OPERATION
ME FINAL TRANSFER OPERATION
MS TRANSFER INITIATION OPERATION
M1, M2 ADVANCED TRANSFER OPERATION
M*1, M*2 SUCCEEDING TRANSFER OPERATION
MX(+) FIRST POSITIVE TRANSFER OPERATION
MX(-) FIRST NEGATIVE TRANSFER OPERATION
MY(+) SECOND POSITIVE TRANSFER OPERATION
MY(-) SECOND NEGATIVE TRANSFER OPERATION

The invention claimed is:

1. A lower receiving pin arrangement method for an electronic parts mounting apparatus that mounts electronic parts on a substrate, wherein a plurality of lower receiving pins for receiving and supporting a downside of the substrate are arranged at arbitrary positions in a lower receiving area set in a lower receiving base, the method comprising:

an arrangement performance step of transferring the lower receiving pin, from a temporary placement position set in a pre-array temporary placement area which is set in the lower receiving base along a first direction and where the plurality of lower receiving pins are temporarily placed before arranged, and arranging the transferred lower receiving pin at an array position in the lower receiving area;

wherein individual transfer operations to be performed, in the arrangement performance step, transfer in turn the lower receiving pins from the temporary placement positions to the array positions, such that the lower receiving pins are transferred in order of decreasing sequence of a respective first-direction coordinate value of the array position of each of the lower receiving pins, and the individual transfer operations include:

a combination of at least two of a first positive transfer operation that is transferred in a positive direction along the first direction, a first negative transfer operation transferred in a negative direction along the first direction, a second positive transfer operation transferred in a positive direction along a second direction orthogonal to the first direction, and a second negative transfer operation transferred in a negative direction along the second direction; and a final transfer operation in which the lower receiving pins reach the array positions in each of the individual transfer operations is the first positive transfer operation.

2. The lower receiving pin arrangement method according to claim 1, wherein either the second positive transfer operation or the second negative transfer operation is performed in the individual transfer operation targeted for the lower receiving pin prior to the final transfer operation when a first-direction coordinate value of the array position is larger than a first-direction coordinate value of the temporary placement position by a predetermined margin value or more; and in the individual transfer operation targeted for the lower receiving pin, performing the first negative transfer operation is followed by performing either the second positive transfer operation or the second negative transfer operation prior to the final transfer operation when the first-direction coordinate value of the array position is smaller than a limit value which is determined by adding a predetermined margin value to the first-direction coordinate value of the temporary placement position.

3. The lower receiving pin arrangement method according to claim 1, wherein the temporary placement positions are set, in an increasing sequence of distance from an origin of coordinates in the first direction, in the pre-array temporary placement area set along an edge whose second-direction coordinate value is small; and in a pre-array temporary placement position assignment step processing of which is performed prior to the arrangement performance step to thereby individually assign the plurality of arranged lower receiving pins respectively to the temporary placement areas, a sequence in which the temporary placement positions become more distant from the origin of coordinates is brought into correspondence to a sequence in which first-direction coordinate values of the array positions of the plurality of arranged lower receiving pins become smaller, thereby performing the assignment.

* * * * *